United States Patent [19]

Smeets

[11] 4,326,211
[45] Apr. 20, 1982

[54] N+PP−PP−P+ AVALANCHE PHOTODIODE

[75] Inventor: Eugenius T. J. M. Smeets, Eindhoven, Netherlands

[73] Assignee: U.S. Philips Corporation, New York, N.Y.

[21] Appl. No.: 179,865

[22] Filed: Aug. 20, 1980

Related U.S. Application Data

[63] Continuation of Ser. No. 935,026, Aug. 18, 1978, abandoned.

[30] Foreign Application Priority Data

Sep. 1, 1977 [NL] Netherlands ................. 7709618

[51] Int. Cl.³ .................. H01L 21/265; H01L 31/10
[52] U.S. Cl. ........................................ 357/30; 357/13; 357/89; 357/91
[58] Field of Search ............... 357/13, 30, 14, 89, 357/90

[56] References Cited

U.S. PATENT DOCUMENTS

| | | | |
|---|---|---|---|
| 3,201,664 | 8/1965 | Adam | 357/14 |
| 3,483,441 | 12/1969 | Hofflinger | 357/13 |
| 3,574,008 | 4/1971 | Rice | 357/14 |
| 3,886,579 | 5/1975 | Ohuchi et al. | 357/13 |
| 3,904,449 | 9/1975 | DiLorenzo et al. | 357/13 |
| 4,045,252 | 8/1977 | Moutou | 357/13 |
| 4,083,062 | 4/1978 | Ohuchi et al. | 357/13 |
| 4,127,932 | 12/1968 | Hartman et al. | 357/13 |
| 4,129,878 | 12/1978 | Webb | 357/13 |
| 4,142,200 | 2/1979 | Mizushima et al. | 357/13 |

OTHER PUBLICATIONS

Bollen et al, "The Avalanche Photodiode", Philips Technical Review, vol. 36, No. 7, pp. 205–210 (1976).
Webb et al, "Properties of Avalanche Photodiodes", RCA Review, vol. 35, pp. 234–278 (1974).

Primary Examiner—William D. Larkins
Attorney, Agent, or Firm—Thomas A. Briody; Robert T. Mayer; Steven R. Biren

[57] ABSTRACT

A radiation-sensitive semiconductor device includes a radiation-detecting avalanche diode which has a semiconductor layer structure made up of four layers of the same type conductivity. The fourth semiconductor layer is located above the third layer and has a higher doping concentration than that of the third layer. This fourth layer substantially improves the noise properties of the device, by a factor of about 2. The radiation-sensitive semiconductor device is manufactured by a method in which the first and third layers of the semiconductor layer structure are provided by epitaxial growth, while the second and fourth layers of the structure are provided by ion implantation. The structure and method of the invention are particularly useful in the manufacture of avalanche photodiodes with an improved noise factor.

11 Claims, 9 Drawing Figures

N+PP−PP−P+ AVALANCHE PHOTODIODE

This is a continuation of application Ser. No. 935,026, filed Aug. 18, 1978, now abandoned.

BACKGROUND OF THE INVENTION

The invention relates to a semiconductor device having an avalanche diode for detecting radiation, comprising a semiconductor body having a semiconductor layer structure of a first conductivity type, which layer structure comprises successively at least a first, low-doped semiconductor layer of substantially homogeneous doping, a second semiconductor layer having a doping concentration which is higher than the doping concentration of the first layer, and a third semiconductor layer having a lower doping concentration than the second layer, said layer structure comprising on one side a first contact layer which forms a nonrectifying junction with the first semiconductor layer and comprising on the other side a second contact layer which forms a rectifying junction with the last semiconductor layer of the layer structure.

The invention also relates to a method of manufacturing the device.

A semiconductor device of the kind described is known from Philips Technical Review, vol. 36 (1976) pp. 205–210.

Semiconductor devices of a variety of natures may be used for detecting radiation. The radiation may be both of a corpuscular nature and of an electromagnetic nature. Although in this application the detection of electromagnetic radiation will mainly be described, the device according to the invention is not restricted to the detection of electromagnetic radiation. In principle the device may be used for the detection of any type of radiation which can generate electron-hole pairs in a semiconductor crystal lattice by absorption of energy.

For the detection of electromagnetic radiation, radiation-sensitive resistors, diodes and transistors usually referred to respectively as photoresistors, photodiodes and phototransistors, are used. Which of these devices is to be preferred for a given application is determined by various factors, inter alia the response time, the quantum efficiency, the noise properties and the amplification desired. For many applications the so-called avalanche photodiode is preferred due to its internal amplification and its very short response time. This is the case in particular in optical communication systems.

The ordinary photoavalanche diode has a PN junction which is biased in the reverse direction to such a voltage that avalanche multiplication of charge carriers which are generated by incident radiation in the depletion zone occurs. The field strength distribution over the successive semiconductor layers, however, is comparatively unfavorable. With the minimum thickness of the depletion zone which is required to achieve a reasonable quantum efficiency (for example, for radiation having a wavelength of approximately 0.9 micron in a P+PN+ silicon diode approximately 25 microns), the voltage across the diode is consequently comparatively high, which is undesirable in many applications.

It has been endeavored to improve this unfavorable condition by using a N+PπP+ (or P+NvN+) structure, wherein π and v, respectively, denote very low doped P and N types. As a result of this the field distribution is changed so that with the same thickness of the depletion zone and with the same value of the maximum field strength the overall voltage across the diode is considerably lower than in a P+PN+ diode. A disadvantage in an N+PπP+ diode, however, is that the avalanche multiplication which takes place in the P region, which for technological reasons usually is comparatively thin, must occur over a sufficient width so as to achieve the desired multiplication. Consequently the maximum field strength becomes high resulting in a higher noise factor.

In order to improve this, a N+PP+πP+ structure has been suggested, see the already-mentioned publication in Philips Technical Review. Using this structure the rate of change of field strength across the PP+ region becomes less and the avalanche region becomes wider so as that a reasonable avalanche multiplication can be effected with lower values of the maximum field strength. With this structure a very low noise factor can be obtained.

SUMMARY OF THE INVENTION

One of the objects of the invention is to provide an avalanche diode for detecting radiation in which the noise is significantly reduced as compared with the last-mentioned structure. The invention is inter alia based on the recognition of the fact that the end in view can be reached by the addition of a further layer or layer portion having a suitably chosen doping.

For that purpose, a semiconductor device of the kind described above is characterized according to the invention in that the layer structure comprises between the second contact layer and the third semiconductor layer a fourth semiconductor layer of the first conductivity type having a doping concentration which is higher than that of the third semiconductor layer.

It has been found that the addition of the said fourth semiconductor layer involves an unexpected improvement in noise properties. The reason for this improvement is not yet clearly understood. The fact that in the absence of the fourth semiconductor layer, with a comparatively low and homogeneously doped third layer, the electric field throughout the thickness of said layer is substantially constant so that the ionization coefficients $\alpha$ for electrons and $\beta$ for holes each individually are also constant throughout the whole thickness of the third layer, presumably plays a part. The noise capacity is proportional to $M^2(2+k \cdot M)$, wherein M is the multiplication factor, and k is a factor which depends inter alia on the spatial variation of $\alpha$ and $\beta$ in the layer in which avalanche multiplication occurs. For a mathematical expression for k, reference is made to RCA Review Vol. 35 (1974) pp. 234–278, see in particular the formulae (16) and (17) on pages 244 and 245. In the absence of this variation, the value of k can become less favorable. The improvement which is produced by the invention, however, does not depend on the correct explanation of the observed phenomenon.

Although the layer structure of successive layers of the first conductivity type may be either n or p-type, an N+PπPπ(P+) diode in which the layer structure consists entirely of p-type silicon layers is to be preferred due to more favorable noise properties.

Although the device may also be constructed as a mesa structure, a planar structure is preferably used in which the second contact layer forms a planar p-n junction with the layer structure of the first conductivity type.

According to an important preferred embodiment, in order to avoid edge breakdown, a belt-like zone of the second conductivity type is provided as a "guard ring"

which extends from the surface into the semiconductor body down to a larger depth than the second contact layer and adjoins the second contact layer along its whole inner circumference.

The desired doping profile can be realized in a very suitable and reproducible manner by an efficaciously chosen combination of ion implantation and epitaxial growth. In combination therewith, a method of manufacturing a device according to the invention is characterized in that the starting material is a highly doped semiconductor substrate of a first conductivity type which serves as a first contact layer, that a low-doped first semiconductor layer of the first conductivity type is grown epitaxially on said substrate, that ions of a dopant determining the first conductivity type are implanted in the first layer so as to form a second semiconductor layer having a higher doping than the first layer, that a third semiconductor layer of the first conductivity type having a lower doping than the second layer is then formed by epitaxial growth on the first semiconductor layer having therein the implanted second semiconductor layer, that a fourth semiconductor layer having a higher doping than the epitaxial third layer is formed in said epitaxial layer by implantation of ions determining the first conductivity type, and that a second contact layer is provided in contact with the fourth layer and forms a rectifying junction with the fourth layer.

BRIEF DESCRIPTION OF THE DRAWING

The invention will now be described in greater detail with reference to various embodiments and the drawing, in which.

DETAILED DESCRIPTION

Figure 1:
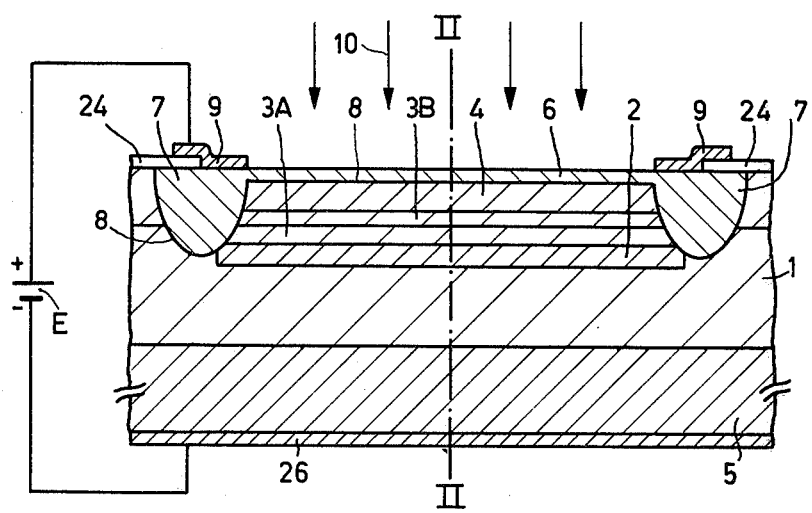
FIG. 1 is a diagrammatic cross-sectional view of a photoavalanche diode according to the invention.

The figures are diagrammatic and not drawn to scale, the dimensions in the thickness direction being exaggerated for clarity.

Corresponding parts are generally referred to by the same reference numerals. Semiconductor regions of the same conductivity type are generally shaded in the same direction in the cross-sectional views.

FIG. 1 is a diagrammatic cross-sectional view of a semiconductor device according to the invention. The device comprises an avalanche diode, in this example a photoavalanche diode, for detecting radiation, in this example electromagnetic radiation having a wavelength of approximately 0.9 micron. The device comprises a semiconductor body having a semiconductor layer structure (1, 2, 3, 4) of a first conductivity type, in this example the p-conductivity type. Said layer structure comprises successively a first low-doped p-type semiconductor layer 1 having a substantially homogeneous doping, a second p-type semiconductor layer 2 having a doping concentration which is higher than the doping concentration of the first layer, and a third p-type semiconductor layer 3, in this example consisting of two parts 3A and 3B (see FIG. 1) having a lower doping concentration than the second layer 2.

The layer structure which in addition comprises the p-type layer 4 to be described hereinafter is provided on one side, namely on the layer 1, with a first contact layer 5 (in this example a highly doped p-type semiconductor layer) which forms a nonrectifying junction with the first semiconductor layer 1, and is provided on the other side with a second contact layer 6 which forms a rectifying junction with the last semiconductor layer 4 of the layer structure. In this example the layer 6 consists of an n-type semiconductor layer which forms a planar p-n junction 8 with the p-type layer 4. However, it is by no means essential for the layers 5 and 6 to be semiconductor layers; for example, the layer 5 may alternatively be a metal layer which is provided on the layer 1 and which forms a nonrectifying ohmic contact with the layer 1, while the layer 6 may alternatively be a conductive layer which forms a rectifying (Schottky) junction with the layer 4. In this example, all semiconductor layers are silicon; the layer 1 has a resistivity of approximately 50 Ohm.cm (doping concentration $2.6 \times 10^{14}$ atoms/cm$^3$), the layer 2 has a maximum doping concentration of approximately $10^{16}$ atoms/cm$^3$, and the layer 3 comprises a part 3A which is formed by a material of the layer 1 and a part 3B having a resistivity of approximately 160 ohm.cm (doping concentration approximately $8 \times 10^{13}$ atoms/cm$^3$).

According to the invention, the layer structure comprises between the second contact layer 6 and the third semiconductor layer 3 a fourth semiconductor layer 4, likewise of the p-conductivity type, having a doping concentration which is higher than that of the third semiconductor layer 3. In this example the doping of the layer 4 is substantially homogeneous, while the doping concentration is $7 \times 10^{15}$ atoms/cm$^3$. The layers 1 and 2 constitute the drift region and the layers 3 and 4 constitute the avalanche region of the photo-avalanche diode.

Figure 2:
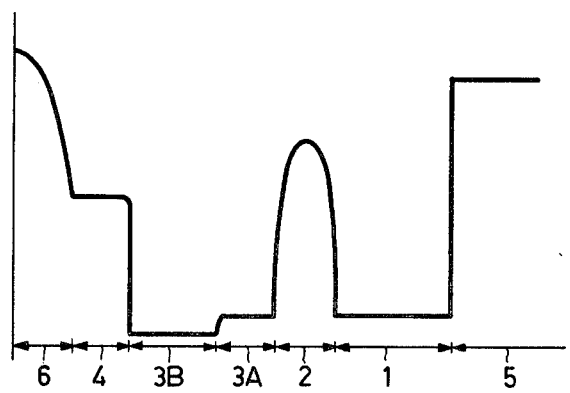
FIG. 2 shows diagrammatically the doping profile taken on the line II—II of the diode shown in FIG. 1.

FIG. 2 shows diagrammatically the relative dopings of the various layers taken on the cross-sectional line II—II of FIG. 1. The device described is symmetrical, for instance rotationally symmetrical, with the line II—II of FIG. 1 as a symmetry axis; however, this is by no means necessary and numerous other geometries may be used without departing from the scope of this invention. The device furthermore comprises a belt-like zone 7 which extends from the surface down to the layer 2 and contacts the n-type layer 6. The zone 7 adjoins the layers 2, 3 and 4 along its whole inner circumference. Said belt-like zone serves to avoid edge breakdown at the p-n junction 8. A connection conductor in the form of a metal electrode layer 9 contacts the n-type region (6, 7), the metal layer 9 on the layer 6 comprising a window through which electromagnetic radiation (10) can be incident on the second contact layer (6). The surface is partly covered with an insulating layer, for example a silicon oxide layer 24. The region 5 has an electrode layer 26.

As shown in FIG. 1, in the operating condition the electrode layers 9 and 26 of the diode are connected to a voltage source E, so that the diode is biased in the reverse direction until a reverse voltage value occurs at which the desired avalanche multiplication occurs. For details regarding the physical action, which is the same as in known photoavalanche diodes, reference is made to the relevant literature, for example, the above-mentioned article in Philips Technical Review vol. 36 (1976) pp. 205-210.

It has been found that in this diode the above-mentioned noise factor k is approximately 0.01, whereas in the same diode in the same conditions and in the absence of the layer 4 it is approximately twice as large. This was established in a process in which the layer 4 was provided as last layer by ion implantation, by measuring the factor k prior to and after providing the layer 4.

The manufacture of the device shown in FIG. 1 will now be described in greater detail with reference to FIGS. 3 to 7.

FIRST EXAMPLE

The starting material (see FIG. 3) is a substrate 5 of a p-type silicon, preferably having a (100) orientation, with a doping of approximately $10^{19}$ atoms/cm$^3$ and a thickness of approximately 250 microns. A p-type silicon layer 1 having a thickness of 20 microns and a resistivity of 50 Ohm.cm (doping approximately $2.6 \cdot 10^{14}$ atoms/cm$^3$) is grown epitaxially thereon using known methods which are generally used in semiconductor technology. A mask of an insulating layer 20 is then formed on the surface by means of known photolithographic methods, for example, a silicon oxide mask which can be obtained inter alia by thermal oxidation succeeded by etching with the use of a photolacquer mask.

Figure 3:
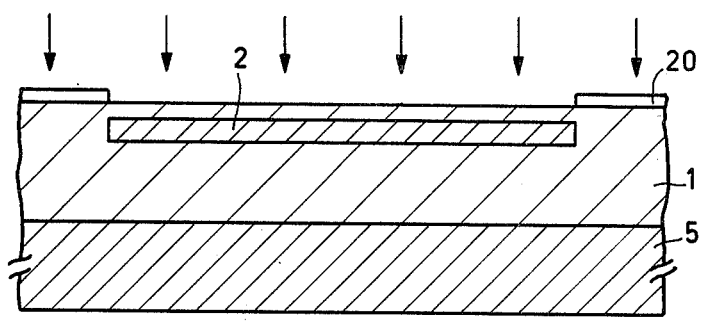
FIGS. 3 to 7 are diagrammatic cross-sectional views of the device shown in FIG. 1 in successive stages of its manufacture.

While using the layer 20 as an implantation mask, a p-type layer 2 is then formed so that the structure shown in FIG. 3 is obtained. In this example this is carried out by implantation of boron ions with an energy of 160 KeV and a dose of $1.56 \cdot 10^{12}$ ions per cm$^2$. However, other methods may alternatively be used for providing the layer 2. Furthermore, instead of a single implantation, two or more successive implantations may alternatively be carried out using different energies and doses. In this example the resulting layer 2 is situated at some distance below the surface. After implantation, the structure is annealed in an inert atmosphere, for example in argon or nitrogen, at approximately 800°-900° C. so as to remedy the crystal damage done. The diameter of the (circular) window in the layer 20 and also of the layer 2 is, for example, 400 microns. Although in this example the layer does not extend up to the surface of the layer 1, the layer 2 may alternatively be provided so that either during the implantation or during the subsequent thermal treatment it extends up to or even slightly over said surface.

Figure 4:
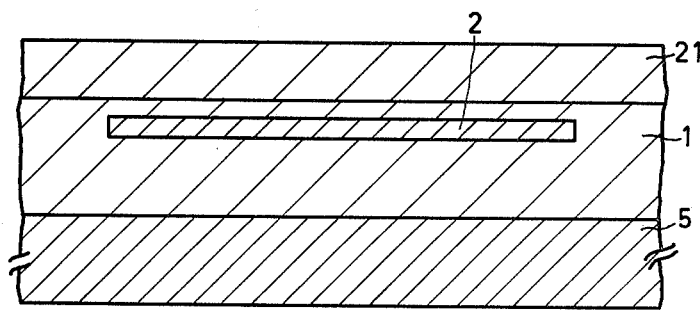

The oxide layer 20 is then removed, after which a further p-type silicon layer 21 is provided on the surface by epitaxial growth. In this example the layer 20 has a thickness of 2.9 microns; the resistivity is approximately 160 Ohm.cm (doping approximately $8 \cdot 10^{13}$ atoms/cm$^3$). The structure shown in FIG. 4 is then obtained.

Figure 5:
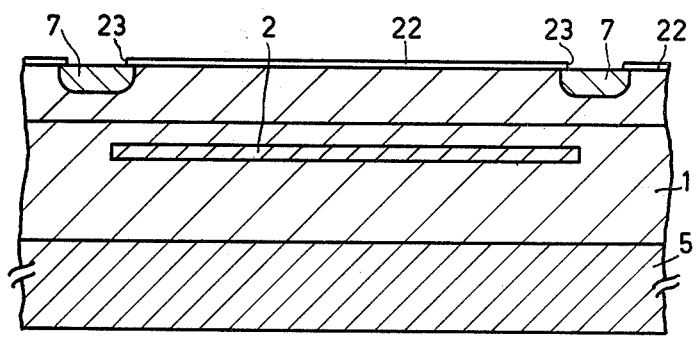
Figure 6:
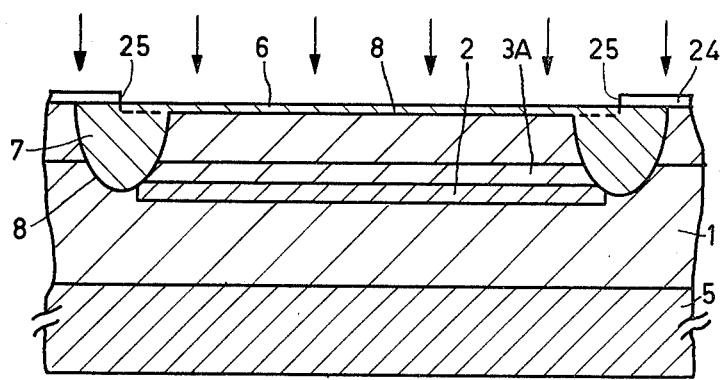
Figure 7:
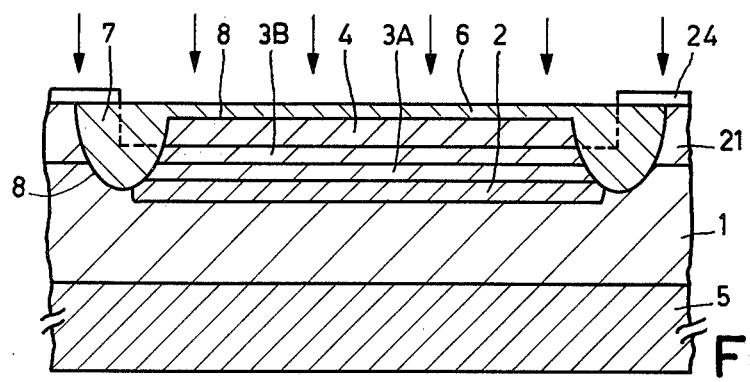

The surface of the layer 21 is then oxidized thermally at approximately 1050° C. for 1 hour in moist oxygen. As a result of this the oxide layer 22 (see FIG. 5) is formed. A belt-like aperture 23 is etched in said oxide layer. While using the silicon oxide layer 22 as a mask, phosphorus is diffused via said belt-like aperture 23 so as to form the n-type zone 7. The surface concentration of the zone 7 is in this example approximately $10^{19}$ atoms/cm$^3$; the thickness in this stage of FIG. 5 is approximately 1.75 microns. For this purpose a phosphorus deposition at 975° C. for approximately 20 minutes is carried out.

In order to give the belt-like zone 7 the desired thickness, the structure is now heated at approximately 1130° C. in an oxidizing atmosphere. The zone 7 diffuses through the epitaxial layer 21 down to the layer 2 (see FIG. 6). After this diffusion step an approximately 3 microns thick oxide layer 24 is provided on the whole surface in one or several steps by pyrolytic deposition from an atmosphere containing SiH$_4$ and oxygen. A window 25 is then etched in said thick oxide layer 24. Using the layer 24 as a masking layer, arsenic ions are then implanted through the window 25. This may be carried out in one or more implantation steps, for example, by a first implantation step of 30 Kev succeeded by a second implantation step of 80 KeV, both with a dose of $4 \cdot 10^{14}$ ions per cm$^2$. Then the structure is annealed at 900° C. for approximately 30 minutes in an inert atmosphere (argon or nitrogen). An approximately 0.25 micron thick n-type surface layer extending into the diffused guard ring 7 is thus obtained (see FIG. 6).

The layer 4 which is characteristic of the invention is then provided. For that purpose, in order to obtain the desired layer thickness and doping, in this example, 9 successive ion implantation steps are carried out in which boron ions are implanted with energies of successively 1000, 800, 675, 560, 435, 330, 240, 160 and 97 KeV, the dose in each implantation step being $9 \cdot 10^{10}$ ions per cm$^2$. As a result of this a layer 4 is formed having a substantially homogeneous doping (see FIG. 2) of approximately $7 \cdot 10^{15}$ atoms per cm$^3$ and a thickness of approximately 1.6 microns.

After the last annealing treatment to reduce the crystal lattice damage produced by the implantation of the layer 4, the annular electrode layer 9 and the electrode 26 can be provided in the usual manner by vapor-deposition or sputtering and etching. An anti-reflection layer (not shown) may also be provided on the layer 6 on the side of the incident radiation 10.

The breakdown voltage of the diode thus manufactured is 150 volts.

During the process described, the noise of the diode was measured by means of pressure contacts immediately prior to and immediately after providing the layer 4. It was established that the factor k prior to the implantation of the layer 4 had a value of 0.020 and after the provision of the layer 4 had a value of approximately 0.014.

SECOND EXAMPLE

Figure 8:
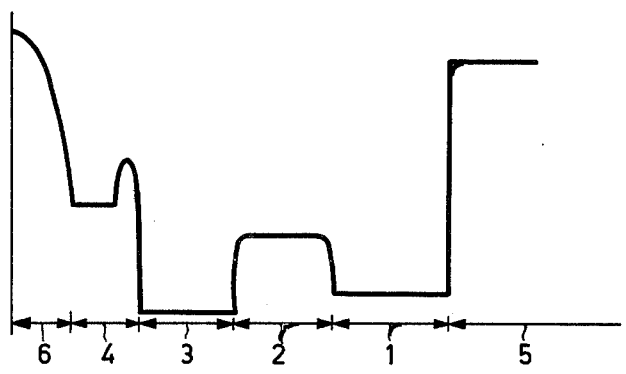
FIG. 8 shows the doping profile of a device according to the invention in another embodiment.

In a second experiment, a layer 1 was grown epitaxially to a thickness of 22 microns and a resistivity of approximately 200 Ohm.cm (doping approximately $6.5 \cdot 10^{13}$ atoms/cm$^3$). The layer was provided by means of 9 boron implantations each with a dose of $8.4 \cdot 10^{10}$ ions/cm$^2$ and energies of successively 1000, 800, 675, 560, 435, 330, 240, 160 and 97 KeV. As a result of this the doping of the layer 2 becomes substantially homogeneous and was $6 \cdot 10^{15}$ atoms/cm$^3$; the thickness was 1.5 microns. The layer 4 was similarly provided by means of 9 boron implantations with energies of successively 1000, 800, 675, 560, 435, 330, 240, 260 and 97 KeV. The dose for the implantation at 1000 KeV was $3 \cdot 10^{11}$ ions/cm$^2$, that of the remaining implantation steps was each time $4.5 \cdot 10^{10}$ ions/cm$^2$. Thus the layer 4 obtained a thickness of approximately 1.6 microns with a region of increased doping concentrations of at most approximately $2 \cdot 10^{16}$ atoms/cm$^3$ near the boundary with the third layer 3 and for the remaining part a substantially homogeneous doping of $6 \cdot 10^{15}$ atoms/cm$^3$. The other process steps were the same as those of the first example. The breakdown voltage of the diode was 220 Volts, the factor k was 0.012. The doping profile is shown in FIG. 8.

THIRD EXAMPLE

In this example an epitaxial layer 1 having a thickness of 20 microns and a resistivity of 46 Ohm.cm was grown. The layer 2 was provided with a single boron ion implantation at 160 KeV with a dose of $2.56 \cdot 10^{12}$ ions/cm$^2$. The epitaxial layer 21 had a thickness of 2.9 microns as in the first example, but a resistivity of 50 Ohm.cm, so approximately equal to that of the layer 1. The layer 4 was provided in the same manner as the first example. The breakdown voltage was 220 volts and the factor k was 0.009. The doping profile was analogous to that of FIG. 2.

It appears from these examples that planar photo-avalanche diodes with a very low noise factor can be obtained by using the structure according to the invention. However, the invention is not restricted to the examples described. The various layers may alternatively be provided in a manner other than indicated in as far as the relative mutual dopings according to the invention are observed.

The semiconductor material used may alternatively be different from silicon. In semiconductor materials in which the ionization coefficient $\alpha$ for electrons is larger than that ($\beta$) for holes at the same voltage, for example in silicon, the layer structure will preferably be p-type conductive, whereas in materials in which $\beta < \alpha$, for example germanium, said layers will preferably be n-type conductive.

Instead of the planar structure as described in the examples, a mesa structure may be used.

Instead of a semiconductor or "second" contact layer, a conductive layer which may or may not be metallic, and which is not a semiconductor layer, may be used, which conductive layer forms a rectifying junction with the "fourth" layer.

Figure 9:
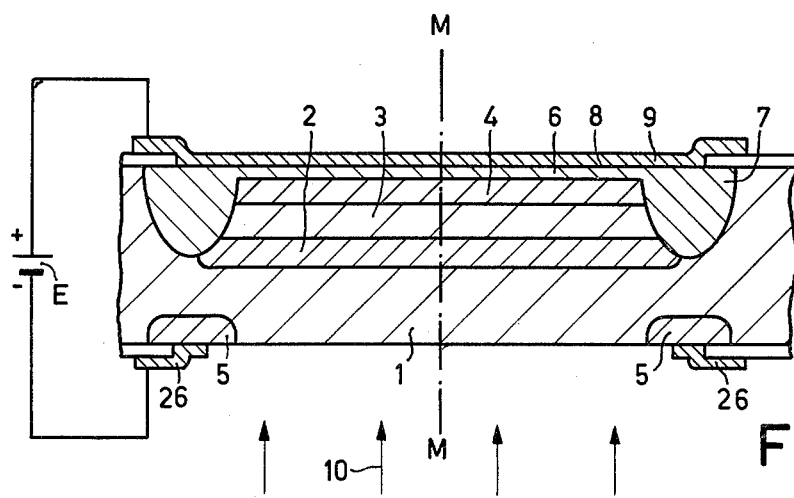
FIG. 9 is a diagrammatic cross-sectional view of a modified embodiment of the device in accordance with the invention.

Of importance also is the case in which, in contrast with the above-described examples, the first contact layer which is provided on the first semiconductor layer 1 comprises a connection conductor having a window through which radiation can be incident on the layer structure. Such a modified embodiment is shown diagrammatically in the cross-sectional view of FIG. 9. The device of FIG. 9 is symmetric, for instance rotationally symmetric about the line M—M; with respect to FIG. 1, the same reference numerals denote corresponding components. The p+ layer 5 in this case is annular, as is the electrode 26; the radiation is incident on the p-layer.

It is to be noted that whereas FIGS. 2 and 8 show abrupt transitions in doping concentration, said transitions are shown diagrammatically and in practice they are more or less gradual.

Finally it is to be noted that where in this application implantation energies are mentioned, they relate to the number of KeV taking into account the ion charge. For example, an implantation with boron ions of 1000 KeV may be an implantation of singly-charged boron ions traversing a field of 1000 KV or of doubly-charged boron ions at 500 KV, etc.

What is claimed is:

1. A radiation-sensitive semiconductor device having a radiation-detecting avalanche diode comprising a semiconductor layer structure having a plurality of layers of a first type conductivity located between two contact layers and a window through which incident radiation can pass to be incident on said layer structure, said layer structure comprising successively at least:

a first, lightly-doped semiconductor layer of substantially homogeneous doping;

a second semiconductor layer having a doping concentration which is higher than that of the first layer;

a third semiconductor layer having a lower doping concentration than that of said second layer; and a fourth semiconductor layer having a higher doping concentration than that of the third layer, said fourth layer serving to improve the noise factor of said radiation-detecting avalanche diode, a first contact layer being located on the lowermost side of said layer structure and forming a nonrectifying junction with said first semiconductor layer, and a second contact layer being located on the uppermost side of said layer structure and forming a rectifying junction with the uppermost semiconductor layer of said layer structure, said fourth semiconductor layer being located between said third semiconductor layer and said second contact layer.

2. A semiconductor device as claimed in claim 1, wherein the fourth semiconductor layer has a substantially homogeneous doping.

3. A semiconductor device as claimed in claim 1, wherein the fourth semiconductor layer comprises a region of increased doping concentration near the boundary with the third semiconductor layer.

4. A semiconductor device as claimed in claim 1, wherein the second contact layer is formed by a semiconductor layer of a second type conductivity opposite to that of the first which forms a p-n junction with the fourth layer.

5. A semiconductor device as claimed in claim 4, wherein the p-n junction is a planar junction.

6. A semiconductor device as claimed in claim 5, further comprising a belt-like zone of the second conductivity type which extends from the surface into the semiconductor body down to a depth greater than that of the second contact layer and adjoins the second contact layer along its entire inner circumference.

7. A semiconductor device as claimed in claim 6, wherein the belt-like zone adjoins the second, third and fourth semiconductor layers along its entire inner circumference.

8. A semiconductor device as claimed in claim 1, wherein the first contact layer comprises a highly doped semiconductor layer of the first conductivity type.

9. A semiconductor device as claimed in claim 1, wherein the second contact layer comprises a connection conductor having a window through which incident radiation can pass to be incident on the second contact layer.

10. A semiconductor device as claimed in claim 1, wherein the first contact layer has a connection conductor having a window through which radiation can pass to be incident on the layer structure of the first type conductivity.

11. A semiconductor device as claimed in claim 1, wherein the layer structure consists of p-type silicon layers.

* * * * *